US 6,667,890 B1

(12) United States Patent
Barringer et al.

(10) Patent No.: US 6,667,890 B1
(45) Date of Patent: Dec. 23, 2003

(54) APPARATUS FOR AUTO DOCKING PCI CARDS

(75) Inventors: Dennis R. Barringer, Wallkill, NY (US); Gregory H. Richardson, Sumner, WA (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/194,799

(22) Filed: Jul. 12, 2002

(51) Int. Cl.[7] ............................................. H05K 5/06
(52) U.S. Cl. ......................................... 361/752
(58) Field of Search ....................... 361/752, 753, 361/801, 802, 796, 683, 756, 727, 737, 736; 439/377

(56) References Cited

U.S. PATENT DOCUMENTS

| 5,815,377 | A | 9/1998 | Lund et al. | 361/802 |
|---|---|---|---|---|
| 5,868,585 | A | 2/1999 | Barthel et al. | 439/377 |
| 5,980,281 | A | 11/1999 | Neal et al. | 439/157 |
| 6,030,230 | A | 2/2000 | Peacock | 439/61 |
| 6,062,894 | A | 5/2000 | Barringer | 439/377 |
| 6,071,143 | A | 6/2000 | Barthel et al. | 439/377 |
| 6,181,565 | B1 | 1/2001 | Schmitt et al. | 361/756 |
| 6,185,104 | B1 | 2/2001 | Obermaier | 361/759 |
| 6,288,911 | B1 * | 9/2001 | Aoki et al. | 361/801 |
| 6,311,242 | B1 | 10/2001 | Falkenburg et al. | 710/103 |
| 6,315,586 | B1 * | 11/2001 | Joyce et al. | 439/157 |
| 6,343,018 | B1 | 1/2002 | Takeyama et al. | 361/737 |

FOREIGN PATENT DOCUMENTS

EP     1 014 508 A2    6/2000

* cited by examiner

Primary Examiner—David Martin
Assistant Examiner—Thanh Yen Tran
(74) Attorney, Agent, or Firm—Floyd A. Gonzalez; Cantor Colburn LLP

(57) ABSTRACT

A hot docking mechanism enables a PCI type card with an edge connector to be inserted into an enclosure and docked in a card socket on the motherboard without operator access to the enclosure interior. A card holder carries the card and is supported on a card guide for sliding motion into the enclosure to a position at which the edge connector is aligned with the socket secured to the device motherboard. A camming assembly includes a cam lever extending outside the enclosure to convert horizontal or pivoting motion of the cam lever to vertical motion of the card into and out of the socket. The camming assembly, mounted above and proximate the mother board surface, increases mechanical advantage during docking and undocking. The card is supported within the card holder and the camming connection between the card and camming assembly is disposed intermediate the longitudinal ends of the socket to maximize mechanical advantage and minimize misalignment during card docking and undocking.

20 Claims, 7 Drawing Sheets

APPARATUS FOR AUTO DOCKING PCI CARDS

BACKGROUND OF THE INVENTION

The invention relates to printed circuit card installation in electronic devices. More particularly, the invention relates to a structure and method for auto docking electronic cards engaged by a carrier to be "hot plugged" into an electronic device.

Electronic equipment technicians, and indeed some private individuals as well, are aware that printed circuit boards (PCB) are employed within many pieces of electronic equipment. It is also known by these individuals that these "cards" can in some cases be removed for repair of a device or an upgrade thereof or simply to alter the operating parameters thereof. Most notable are computer devices where different functions or memory capacity can be needed.

Conventionally, the changing of a card is done by removing the cover of the machine and manually removing the existing card and plugging in a new one. This procedure may be complicated further in systems where entire banks of cards must be removed above the one being replaced or the bank of cards where one is to be replaced must removed. In such instances the machine must be shut down. Since both the shut down and start up procedure can be time consuming, shut down is undesirable.

More recently, some electronic equipment has been designed to accept a card carrier comprising a frame with means to insert the card into an electrical receptacle while the cover is still in place on the device. This type of an operation is known as "hot plugging". While the existing hot plugging PCI card carriers are effective and beneficial for their intended purpose, they are card specific. Unfortunately, then, one needs a specific carrier for every type of card he wishes to use.

Examples of such carriers are described in detail in U.S. Pat. No. 6,071,143, filed Dec. 13, 1996, U.S. Pat. No. 5,868,585, filed Dec. 13, 1996, and U.S. Pat. No. 5,815,377, filed Dec. 8, 1997, all assigned to the assignee hereof and all of which are fully incorporated herein by reference.

In mid sized or mini computers it is common to have continuous operation of the computer system. Thus, the installation or replacement of peripheral devices must be effected by hot plugging without disturbing system operation. However, PCI cards, in the normal environment, are installed when the device is shut down and the covers removed for card installation and removal. To realize the benefits of PCI card use, it is necessary to find a means to accomplish hot plugging of such cards while protecting the user from the electrical hazards of an operating, electrically energized system, while minimizing the space needed to employ such a capability. Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades.

With increased circuit density there has also been a concomitantly driven increase in the number of power, signal and control lines which require electrical connections to be made between printed circuit cards and printed circuit boards. This means that the electrical connectors that carry these various electrical circuits between the cards and the boards have been required to carry more and more separate individual connections. A significant consequence of the increase in the number of individual electrical connections, all of which require surety of contact, is the corresponding increase in the force needed to insert printed circuit connectors into mating printed circuit board sockets. This aspect provides special design considerations for card holders that carry printed circuit cards which are meant to be inserted into printed circuit boards via actuating mechanisms.

It is also noted that the present discussion refers to printed circuit boards and printed circuit cards. As contemplated herein, the printed circuit board is the larger component into which at least one printed circuit card is inserted for purposes of electrical connection. The present disclosure places no specific limits on either the size of a printed circuit board or the size of a printed circuit card. In the most general situation, a circuit board will be populated with a plurality of printed circuit cards. That is, the printed board will have a number of printed circuit cards inserted therein. Accordingly, as used herein, the terms "printed circuit board" and "printed circuit card" are considered to be relative terms.

Accordingly, the present inventors are presented with the following sometimes competing packaging problems: connector pin alignment, card holder alignment, rigid connection to a printed circuit board, dense and close packaging, hot pluggability, the desire to provide an easy-to-load card holder for carrying printed circuit cards, and mechanisms requiring a mechanical advantage for insertion and removal of printed circuit cards.

SUMMARY

The problems associated with hot plugging of PCI cards is resolved using a card holder that slides into the enclosure prior to electrical connection. The card is aligned with the connector when fully inserted and is thereafter cammed into the cooperating connector. The camming assembly is mounted on a surface above and proximate the mother board where it provides mechanical advantage during insertion and removal of the PCI card.

The card holder includes a translatable location of support slidably connected to the card holder for mounting edges of the circuit card thereon. A guide assembly is mounted within the enclosure on the surface above and proximate the mother board for slidably supporting and guiding the card holder into the enclosure to a position whereat a circuit card connector of the card is aligned with a card socket extending from the mother board. The camming assembly includes a cam mechanism providing mechanical advantage when a cam mechanism is operated outside of the enclosure to move said card holder toward the mother board and insert the circuit card connector into the socket. The cam lever extends outside the enclosure to convert horizontal or pivoting motion of the cam lever to vertical motion of the card into and out of the socket.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
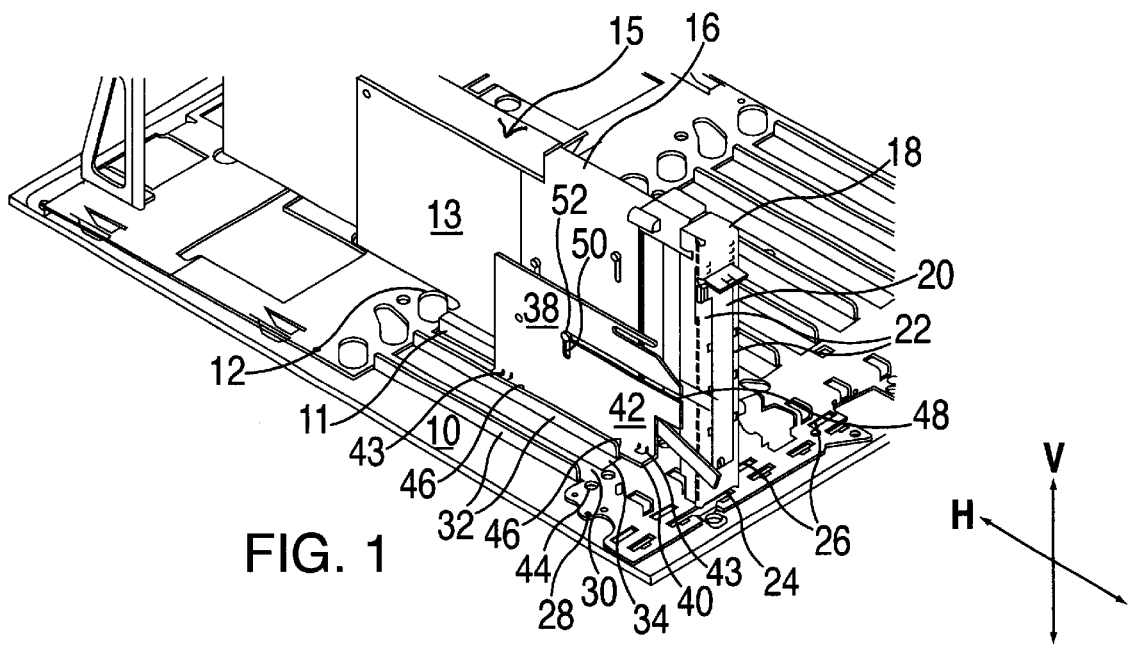
FIG. 1 is a perspective view of a card holder, card guide and cam mechanism of one exemplary embodiment and a PCI card engaged in a socket extending from a mother board and through a guide surface with which the docking assembly cooperates.

FIG. 1 is a perspective view of the parts of one exemplary embodiment of a card docking apparatus of the present disclosure and the mother board 10 with the connector 12 mounted thereon which receives the card edge connector 12. The PCI card 13 is carried by the card holder 15. Card holder 15 has at least one bifurcated carrier 16 slidably mounted to card holder 15. Card holder includes a tail stock bezel 18 mounted to a tail end of card holder 15. Tail stock bezel 18 slidably contains a window bracket 20 that is attached to card 13. Tail stock bezel 18 is preferably in slidable electrical contact with bracket 20 having an EMC seal therebetween disposed along flanges 22 of bezel 18. One end 24 of window bracket is slidably received in an aperture 26 in a guide surface 28 above motherboard 10 when card edge connector 12 of card 13 is connected to socket 11 to prevent card holder 15 from being removed while edge connector 12 is plugged in socket 11.

Each card holder is received in a guide 30 defined by contiguous flanges 32 formed in guide surface 28. Flanges 32 are preferably formed by cutting three sides of a rectangle in surface 28 while folding the flange substantially perpendicular to surface 28 along a fourth side defining a fourth side of the rectangle. In this manner a socket aperture 34 is formed to receive socket 11 through guide surface 28. Guide surface 28 is preferably formed of stamped electrically conductive metal.

A guide assembly 38 is mounted within guide 30 offset to one side between flanges 32 defining guide 30 to allow space for card holder 15 to slide therethrough. More specifically, guide assembly 38 comprises a base 40 from which a guide wall 42 extends substantially perpendicular to base 40. Base 40 is preferably aligned and mounted to guide surface 28 using protrusions 43 extending from said base 40 through holes 44 configured in guide surface 28 and then securing base 40 to guide surface 28 using rivets 46, for example.

Guide wall 42 includes a first slot 48 extending from one end of wall 42 to an intermediary portion of wall 42 in a horizontal direction. First slot 48 further includes a second slot 50 extending substantially perpendicular towards socket 11 at the intermediary portion of wall 42. First and second slots 48, 50 are configured to receive a pin 52 extending from carrier 16 to guide card 13 within card holder 15 when card holder is installed or removed from motherboard 10.

Figure 2:
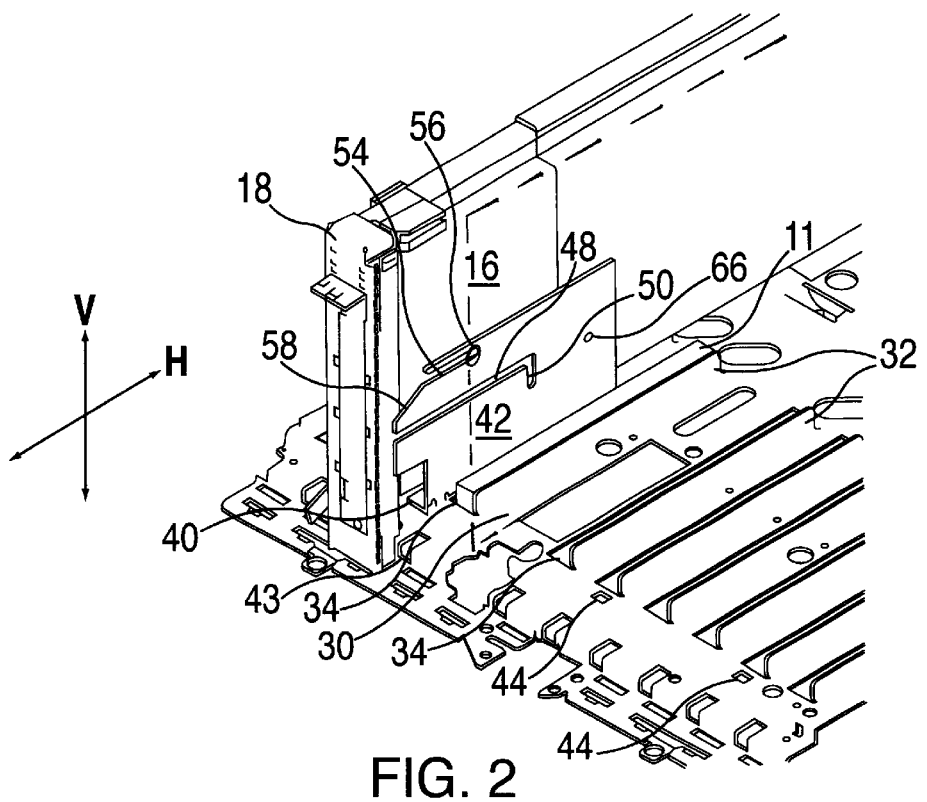
FIG. 2 is a perspective side view from an opposite side of the docking assembly of FIG. 1.

Referring to FIG. 2, a second guide assembly 38 is disposed on the other side of card holder 15 in a contiguous guide 30 having a contiguous socket 11 extending through a contiguous aperture 34 for mounting another card holder 15. It will be noted that the wall 42 of the second guide assembly includes a third slot 54 substantially parallel to said first slot for receipt of a pin element 56 extending from card holder 15 to guide the other side of card holder 15 in guide 30. It will be further recognized that third slot 54 begins in a bight portion 58 configured in wall 42. Bight portion 58 is configured to guide a bottom portion of pin 56 while alignment pin 52 in slot 48 on the opposite side of card holder 15 can be concentrated on. Furthermore, it will be recognized that first and second slots 48, 50 on the second guide assembly are unoccupied to receive another card holder 15 for connection with the second socket 11. It should be noted that although card holder has been described as being slidably mounted between two guide assemblies 38, a single guide assembly 38 is optionally employed on a single side of card holder 15.

Figure 3:
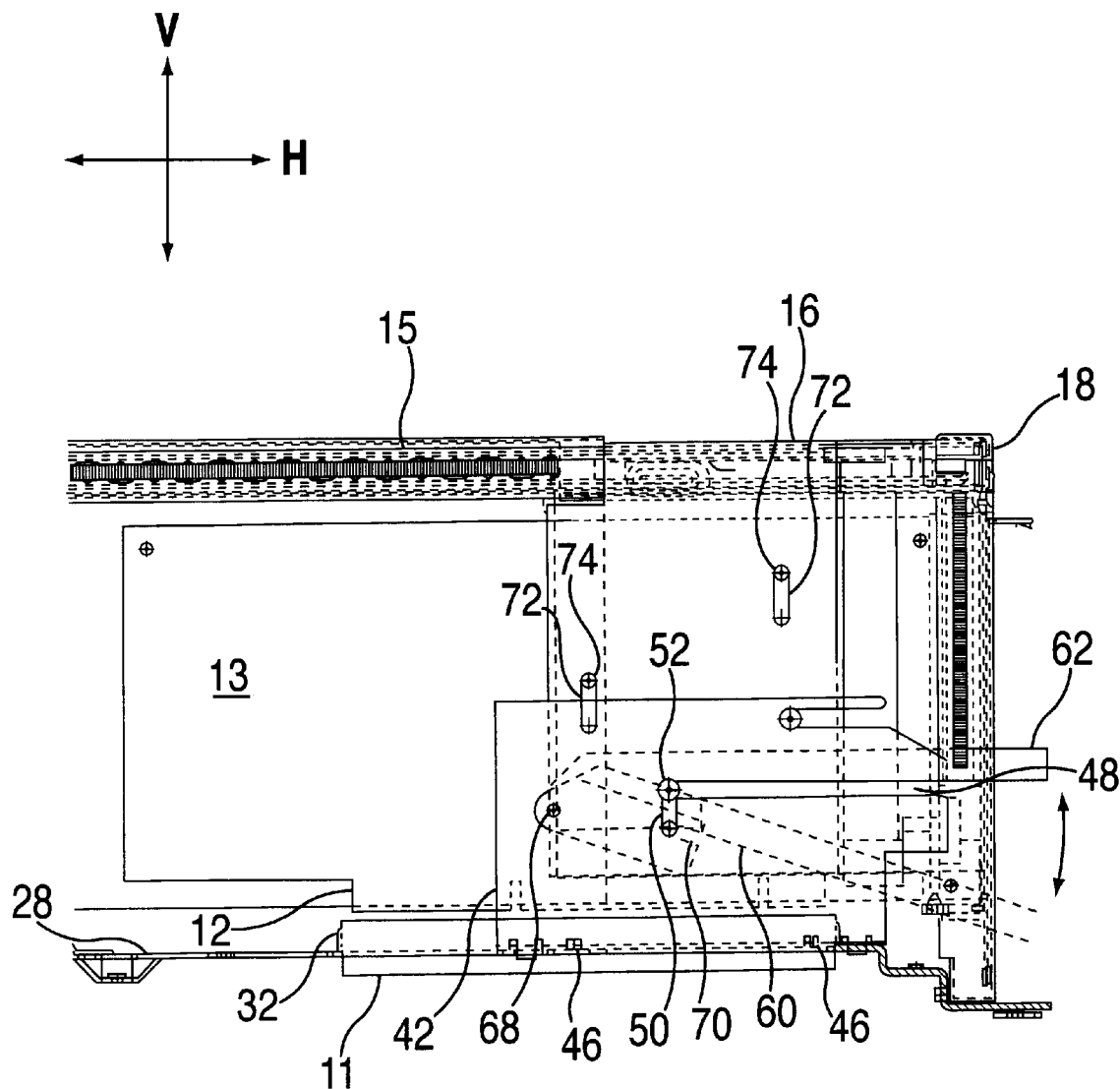
FIG. 3 is a side elevation view of the docking assembly of FIGS. 1 and 2.

Referring now to FIG. 3, a cam assembly 60 is disposed between wall 42 of guide assembly 38 and card holder 15. Cam assembly 60 includes an actuating cam lever 62 extending outside of the enclosure at one end and is preferably pivotally mounted to wall 42 via aperture 66. Cam lever 62 is pivotally mounted to wall 42 at aperture 66 (see FIG. 2) using a rivet 68, for example, or the like. It will be appreciated that cam lever 62 is alternatively pivotally mounted to card holder 15. Cam lever 62 further includes a horizontal slotted opening 70 configured to receive pin 52.

As discussed above, pin 52 is operably connected to card 13 via carrier 16. Carrier 16 includes two vertical parallel guide slots 72 each configured to receive a pin 74 extending therethrough from card holder 15. Parallel slots 72 are configured to restrict translation of card 13 via carrier 16 in a direction to and away from socket 11. More specifically, when cam lever 62 pivotally actuated at the one end, pin 52 within slot 70 is pivoted in an arc defined by a distance between rivet 68 and pin 52. However, because pin 52 is restricted to translate in a vertical direction by containment within slot 50 and by its association with parallel guide slots 72, horizontal slotted opening 70 permits pin 52 to deviate from moving in the arc created by pivoting cam lever 62.

In operation, card holder 15 is manually guides into guide 30 aligning pin 52 in horizontal slotted opening 48, and preferably engages pin 56 on the other side of card holder 15 in horizontal slotted opening 54 in a contiguous card guide assembly 38. Pin 52 is thereinafter received in horizontal slotted opening 70 of cam assembly 60 and aligned with vertical slot 50 when card holder 15 is fully inserted. By pivotally moving cam lever 62 towards guide surface 28, an upper surface defining an upper portion of horizontal slotted opening 70 urges pin 52 towards socket 11, thus urging card connector 12 to be electrically coupled with socket 11. Similarly, movement of cam lever 62 away from guide surface 28 causes a bottom surface defining a bottom portion of horizontal slotted opening 70 to urge pin 52 away from socket 1 land drives card connector 12 out of electrical connection with socket 11. In addition, pin 52 is then aligned with horizontal slotted opening 48 for removal of card holder 15 from the enclosure. It will be recognized that significant mechanical advantage is added by biasing cam lever 62 extending from rivet 68 to engage/disengage card connector 12 with socket 11.

Figure 4:
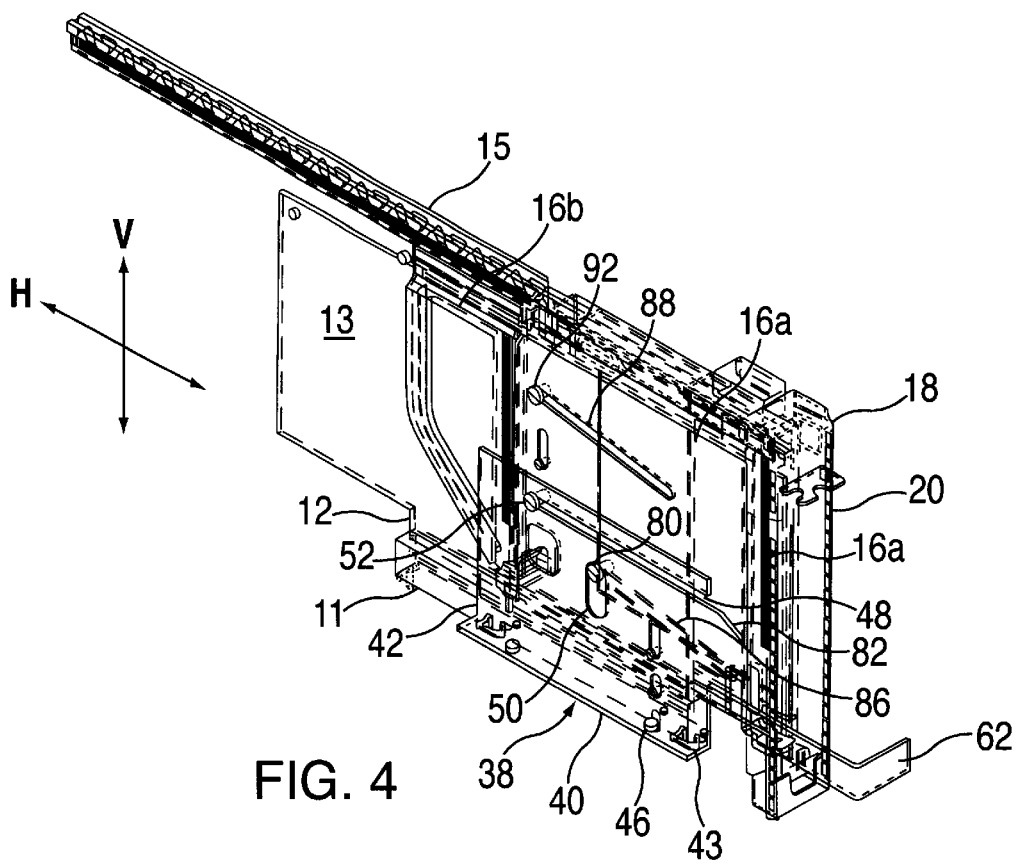
FIG. 4 is a perspective view of a card holder, card guide and cam mechanism of an alternative embodiment of the docking assembly of FIG. 1.
Figure 5:
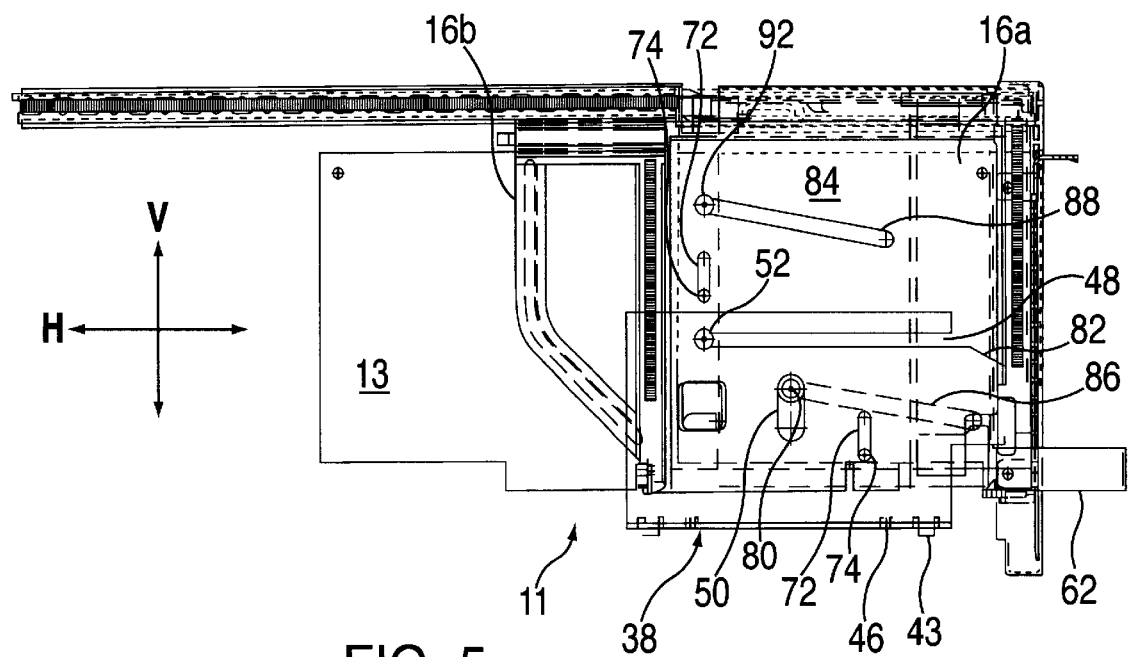
FIG. 5 is a side elevation view of the card holder, card guide and cam mechanism of FIG. 4.

Referring to FIGS. 4 and 5, an alternative embodiment of a docking apparatus is illustrated. FIG. 4 is a perspective view of the parts of card docking apparatus with the connector 12 of card 13 prior to electrically coupling with socket 11. Card holder 15 includes a bifurcated carrier 16a and 16b slidably mounted to card holder 15. Card holder 15 includes tail stock bezel 18 mounted to a tail end of card holder 15. Tail stock bezel 18 slidably contains window bracket 20 attached to card 13. 11. In an exemplary embodiment and still referring to FIG. 4, the printed circuit card holder assembly preferably receives and removably retains edges of a PCI card 15. PCI card 13 is carried by the card holder 15 having two bifurcated arms or carriers 16a and 16b. Each of the carriers 16a and 16b present slots (not shown) configured to grasp an edge portion of card 13. Carrier 16b is slidable along an extension arm (not shown) formed integrally with and extending from carrier 16a for adjustably grasping other sized cards 15. Such carriers or arms are shown and fully described in U.S. Pat. No. 6,062,894 assigned to the assignee of the present application and is incorporated by reference.

Guide assembly 38 is mounted within guide 30 offset to one side between flanges 32 defining guide 30 to allow for space for card holder 15 to slide therethrough (see FIG. 1). More specifically, guide assembly 38 comprises base 40 from which guide wall 42 extends substantially perpendicular to base 40. Base 40 is preferably aligned and mounted to guide surface 28 using protrusions 43 extending from said base 40 through holes 44 configured in guide surface 28 and then secured using rivets 46, for example.

Guide wall 42 includes a first slot 48 extending from one end of wall 42 to an intermediary portion of wall 42 in a horizontal direction. First slot 48 is configured to receive pin 52 extending from card holder 15 to guide card holder 15 when card holder is installed or removed from motherboard 10. A second slot 50 extends substantially perpendicular towards socket 11 relative to first slot 48 proximate an intermediate section of wall 42 and disposed above and intermediate a longitudinal length of socket 11. Second slot 50 is configured to receive a pin 80 extending from carrier 16a to guide card 13 within a vertical direction when card 13 is installed or removed from socket 11 in motherboard 10. It will be further recognized that first slot 48 begins at a bight portion 82 configured in wall 42. Bight portion 82 is configured to facilitate guiding a bottom portion of pin 52 while inserting card holder 15 into the enclosure.

Still referring to FIGS. 4 and 5, cam assembly 60 is disposed between wall 42 of guide assembly 38 and card holder 15. Cam assembly 60 includes actuating cam lever 62 extending outside of the enclosure at one end and is connected to a slidable wall 84 slidably connected to card holder 15. Slidable wall 84 is configured to translate in a horizontal direction relative to translation of card 13 in a vertical direction. Slidable wall 84 includes a first inclined slotted 86 opening that is parallel to a second inclined slotted opening 88, both configured in wall 84 to allow horizontal translation of wall 84 while translating carrier 16 in a vertical direction via pins 52 and 92 depending to carrier 16 and extending through slotted openings 86, 88. More specifically pin 52 extends through first inclined slotted opening 86 and pin 92 extends through second inclined slotted opening 88.

As discussed above, pin 52 is operably connected to card 13 via carrier 16. Carrier 16 includes two vertical parallel guide slots 72 each configured to receive pin 74 extending therethrough from card holder 15. Parallel slots 72 are configured to restrict translation of card 13 via carrier 16 in a direction to and away from socket 11. More specifically, when cam lever 62 connected to slidable wall 84 is urged toward card holder 15, slidable wall 84 translates in a horizontal direction toward carrier 16b causing pins 80 and 92 fixed to carrier 16a to translate in a vertical direction as a result of pins 80, 92 residing in inclined slotted openings 86 and 88, respectively, and pins 74 residing in slots 74 restricting translation of pins 74 within slots 72 to vertical translation. Moreover, containment of pin 80 within second slot 50 of guide wall 42 restricts movement of card 13 to vertical translation when cam lever 62 is horizontally actuated.

In operation, card holder 15 is manually guided into guide 30 aligning pin 52 in horizontal slotted opening 48. Once pin 52 is fully inserted within horizontal slotted opening 48, further translation of card 13 in the horizontal direction is not possible, unless card holder is manually removed from the enclosure. By urging cam lever 62 towards guide wall 42, slidable wall 84 connected to cam lever 62 is also urged to the left relative to FIGS. 4 and 5. When slidable wall 84 is urged to the left, inclined slots 86 and 88 guide pins 80, 92 enclosed therein, respectively, downward because of parallel inclined slots 86 and 88 slant downward. Pins 80 and 92 are biased downward because pins 80 and 92 are operably connected with carrier 16a which is restricted to vertical motion as a result of slots 72 in carrier 16a having fixed pins 74 within slots 72. Thus, horizontal motion of slidable wall 84 to the left urges pins 80 and 92 towards socket 11, thus urging card connector 12 to be electrically coupled with socket 11. Similarly, movement of cam lever 62 to the right as shown in FIGS. 4 and 5 causes translation of slidable card to the right which in turn urges pins 80 and 92 away from socket 11 and drives card connector 12 out of electrical connection with socket 11. It will be recognized by one skilled din the pertinent art that slots 86 and 88 may be configured having an opposite incline angle, e.g., incline from left to right. In such a case, translation of cam lever 62 to the left drives card connector 12 out of electrical connection with socket 11 and translation to the right drives card connector 12 into electrical connection with socket 11.

Figure 6:
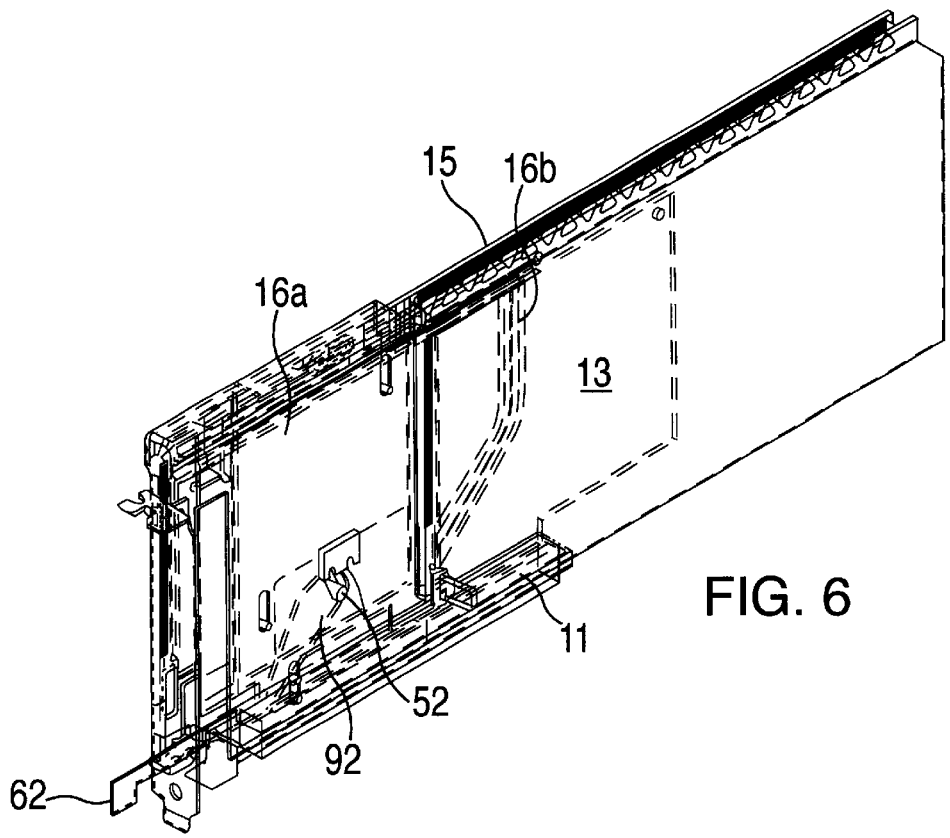
FIG. 6 is a perspective view of a card holder, card guide and cam mechanism of another alternative embodiment of a docking assembly.
Figure 7:
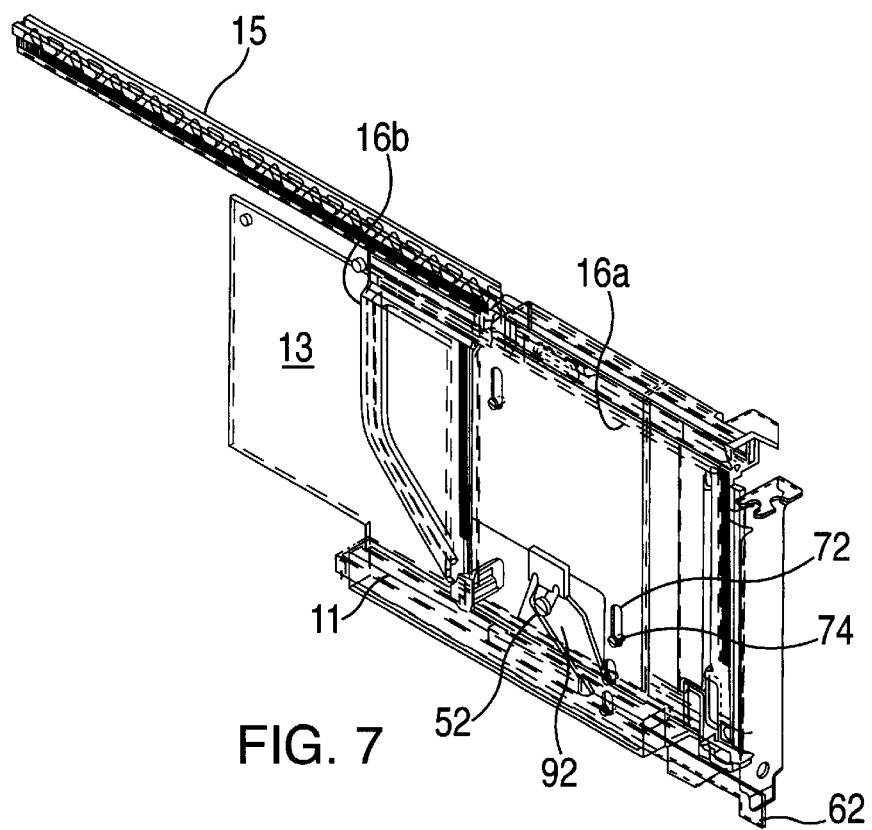
FIG. 7 is a is a perspective side view from an opposite side of the docking assembly of FIG. 6.
Figure 8:
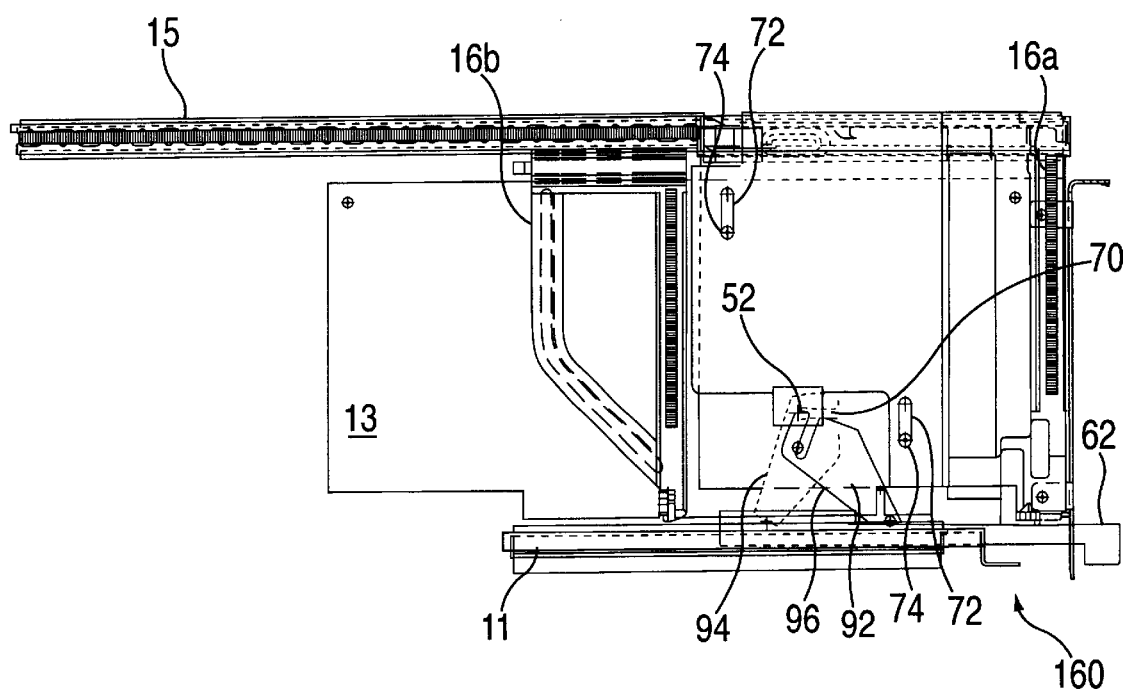
FIG. 8 is a side elevation view of the card holder, card guide and cam mechanism of FIG. 7.

Referring to FIGS. 6–8, another alternative embodiment of a cam assembly 160 for use with a docking apparatus is illustrated. Cam lever 62 is operably actuated by manually urging cam lever 62 in a horizontal direction as before. Cam lever 62 is operably linked to a cam link 92 at one end while an opposite end cam link 92 is configured with a slotted opening 70 configured to receive pin 52 operably connected to card 13. When cam link 92 is in a first position shown generally at 94, slotted opening 70 is oriented to receive pin 52 when card holder 15 in manually guided into the enclosure.

When cam lever 62 is urged in a direction to the right relative to FIG. 8, a bottom portion of cam link 92 pivotally connected to cam lever 62 translates to the right while an upper surface defining an upper portion of slotted opening 70 urges pin 52 toward socket 11 and cam link is in a second position shown generally at 96. As discussed above in detail with previous embodiments, card carrier 16a in restricted to vertical translation as a result of fixed pins 74 within slots 72 configured in carrier 16a to guide and define vertical motion thereof.

Similarly, when cam lever 62 is urged in a left direction relative to FIG. 8 after connector 12 and socket 11 are engaged, cam link 92 is oriented in the first position 94 orienting slot 70 for allowing removal of pin 52 from slot 70 when card holder 15 is removed from the enclosure by translating card holder 15 in the right direction relative to FIG. 8. When cam lever 62 is urged in a direction to the left relative to FIG. 8, the bottom portion of cam link 92 pivotally connected to cam lever 62 translates to the left while a lower surface defining a lower portion of slotted opening 70 urges a bottom portion of pin 52 away socket 11 and cam link is in the first position 94.

Figure 9:
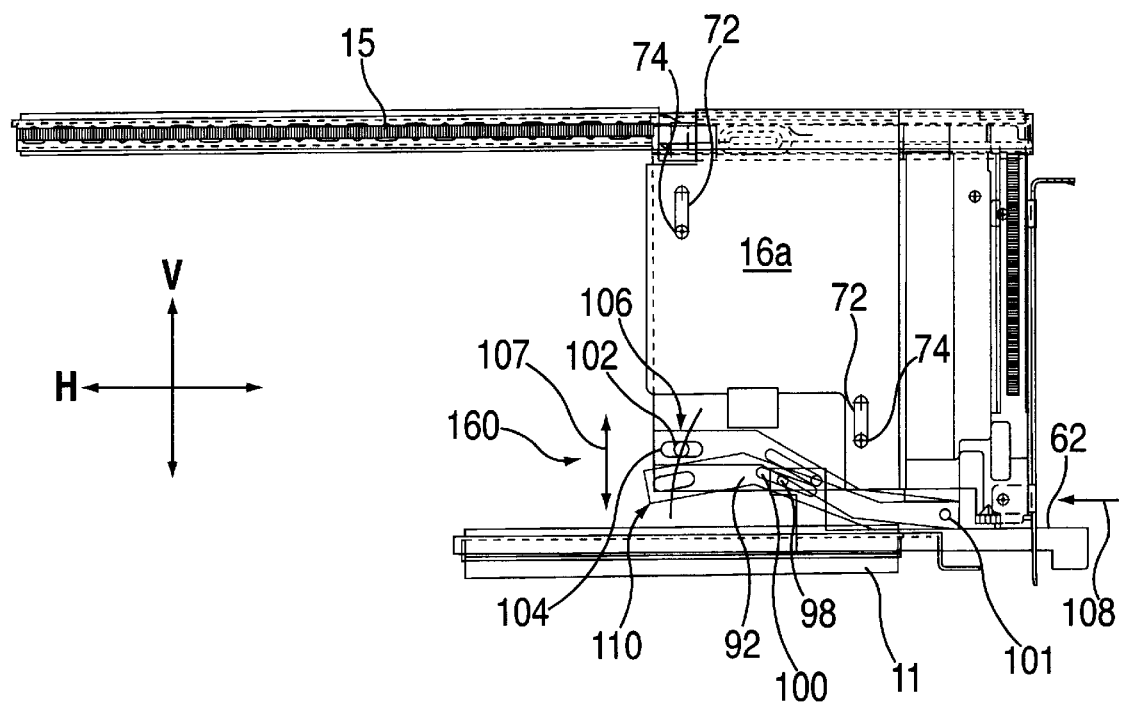
FIG. 9 is a side elevation view of an alternative embodiment of a card holder cooperating with a cam mechanism.

Referring now to FIG. 9, an alternative embodiment of a cam assembly 160 for use with a docking apparatus is illustrated. Cam assembly 160 includes cam lever 62 extending from the enclosure at one end and pivotally connected to cam link 92 at another end. Cam lever 62 is pivotally connected to cam link 92 via a pin 98 and a slot 100 connection. Pin 98 depends from cam lever 62 and is limited to horizontal translation when cam lever 62 is actuated, while slot 100 is configured in an intermediate portion of cam link 92 to retain pin 98. Cam link 92 in pivotally fixed relative to card holder 15 at one end generally shown at 101 and is in operable communication with carrier 16a via a second pin 102 and slot 104 connection. Pin 102 is fixedly secured to carrier 16a and is disposed in slot 104 configured at an opposite end of pivotal attachment 101 of cam link 92.

In operation, when cam lever is urged to the right relative to FIG. 9, cam link 92 is in a first position shown generally at 106 via translation of pin 98 to the right urging an upper surface defining slot 100 upward and operably translating card carrier 16a upward via pin 102 in slot 104. As discussed above in detail with previous embodiments, card carrier 16a is restricted to vertical translation indicated with arrow 107 as a result of fixed pins 74 within slots 72 configured in carrier 16a to guide and define vertical motion thereof. When cam lever 62 is urged to the left as indicated by arrow 108, cam link 92 is in a second position shown generally at 110 via translation of pin 98 to the left urging a lower surface defining slot 100 downward and operably translating card carrier 16a downward via pin 102 in slot 104.

Figure 10:
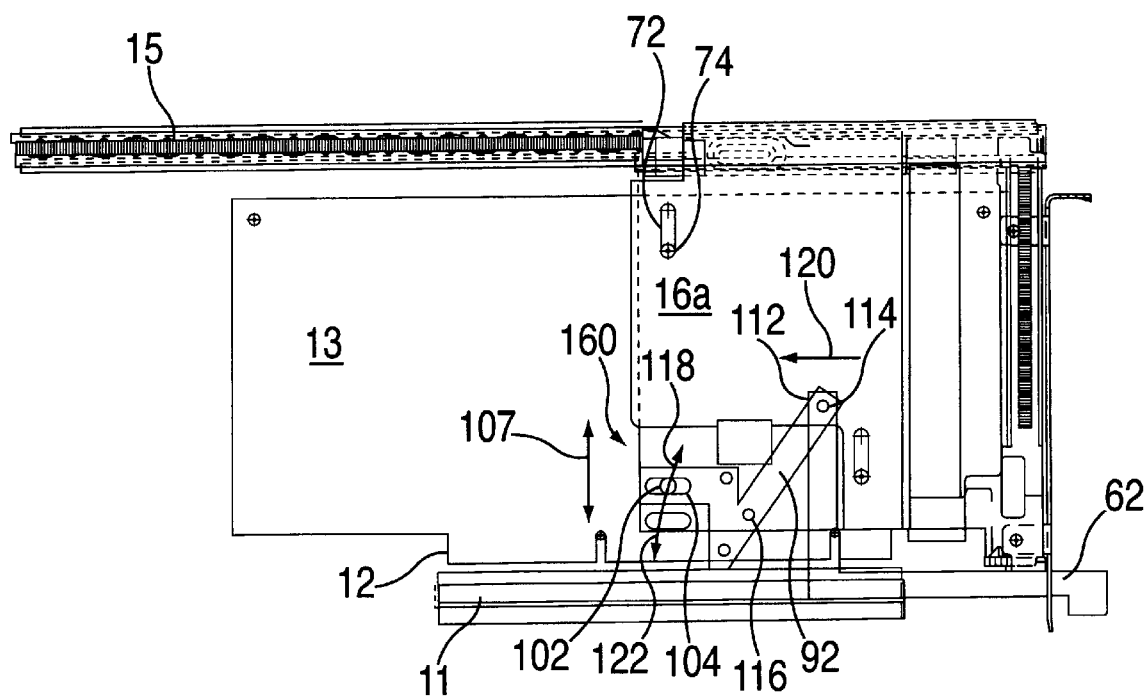
FIG. 10 is a side elevation view of an alternative embodiment of a card holder cooperating with a cam mechanism of FIG. 9.

Referring now to FIG. 10, yet another alternative embodiment of a cam assembly 160 for use with a docking apparatus is illustrated. Cam assembly 160 includes cam lever 62 extending from the enclosure at one end and pivotally connected to cam link 92 at another end. Cam lever 62 is pivotally connected to cam link 92 at one end 112 of cam link 92 via a rivet or pin 114, for example, but not limited thereto. Cam link 92 is pivotally connected to card holder 15 at pin 116 allowing rotation of cam link 62 about pin 116. Cam link 92 is in operable communication with carrier 16a via second pin 102 and slot 104 connection. Pin 102 is fixedly secured to carrier 16a and is disposed in slot 104 configured at an opposite end of one end 112.

In operation, when cam lever 62 is urged to the right relative to FIG. 10, cam link 92 is in a first position as illustrated in FIG. 10. In this position, card connectors 12 of card 13 are not electrically coupled to socket 11, as pin 102 is biased in direction indicated by arrow 118 urging an upper surface defining slot 104 upward and operably translating card carrier 16a upward via pin 102 in slot 104. As discussed above in detail with previous embodiments, card carrier 16a is restricted to vertical translation indicated at 107 as a result of fixed pins 74 within slots 72 configured in carrier 16a to guide and define vertical motion thereof. When cam lever 62 is urged to the left relative to FIG. 10, cam link 92 is pivoted in a counterclockwise direction about pin 116 as cam lever 62 urges cam link 92 to the left indicated by arrow 120 via pivotal connection of cam lever 62 with cam link 92 at pin 114. Counterclockwise rotation about pin 116 causes rotation of pin 102 in a direction indicated by arrow 122 urging a lower surface defining slot 104 downward and operably translating card carrier 16a downward via pin 102 in slot 104.

Although the invention has been shown using a PCI long card, the apparatus is adapted to be used with cards of various size and specifically with an alternate size such as the industry standard short card. It should also be noted that the terms "first", "second", and "third", and the like may be used herein to modify elements performing similar and/or analogous functions. These modifiers do not imply a spatial, sequential, or hierarchical order to the modified elements unless specifically stated.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. In an electrical apparatus wherein a mother board is supported within an enclosure and has a card socket for receiving a circuit card connector, mounted on one surface thereof, a circuit card docking apparatus for installing a circuit card in said card socket from the exterior of said enclosure comprising:

a circuit card holder;

a carrier configured as a translatable location of support for said circuit card slidably connected to said circuit card holder;

a circuit card mounted on said location of support of said circuit card holder and presenting a connector at one edge thereof;

a card guide mounted within said enclosure on said one surface for slidably supporting and guiding said card holder into said enclosure to a position whereat said circuit card connector is aligned with said card socket;

a camming device supported on one of said card holder and said card guide on said one surface and substantially aligned with said socket;

means for connecting said camming device to said circuit card mounted on said card holder when said circuit card is aligned with said socket; and said camming device includes a cam mechanism operable from exterior of said enclosure to move said card holder toward said mother board and insert said connector into said socket.

2. The circuit card docking apparatus of claim 1 wherein said cam mechanism is reversible, moveable in one direction to insect said card connector into said socket and moveable in the opposite of said one direction to remove said connector from said socket.

3. The circuit card docking apparatus of claim 2 wherein said card guide includes at least one flange on one side of said socket extending from said one surface, said at least one flange having a guide slot configured to engage said means for connecting said camming device to said circuit card and a pin extending from said card holder.

4. The circuit card docking apparatus of claim 3 wherein said at least one flange includes a first and a second flange disposed at either side of said card holder, said first and second flanges include a first slot and a second slot configured to guide said card holder for alignment with said socket, a first side of said card holder is guided by said first slot of said first flange while a second side of said card holder is guided by said second slot of said first flange, said first slot of said second flange is operable to guide and align a second card holder with a second socket.

5. The circuit card docking apparatus of claim 3 wherein said at least one flange includes an aperture configured to pivotally mount said camming device between said at least one flange and said card holder.

6. The circuit card docking apparatus of claim 1 wherein circuit card is supported by said card holder at a plurality of locations along the upper edge and at a plurality of locations along the lower edge, each of said plurality of locations includes teeth for selectively adjusting to a size of any circuit card.

7. The circuit card docking apparatus of claim 6 wherein said plurality of locations of support are configured to allow vertical translation of said circuit card relative to said card holder.

8. The circuit card docking apparatus of claim 1 wherein said card holder includes two pins configured therein, said two pins received in corresponding two parallel slots, said two slots configured in said location of support, said slots defining a length and a direction of said translation of said circuit card.

9. The circuit card docking apparatus of claim 1 wherein said means for connecting comprises a pin element carried by said location of support of said card holder and carried by said camming means, said pin element positioned intermediate a longitudinal length of said card socket and respectively engageable with said pin element when said card holder has positioned said circuit card to align said card connector with said socket.

10. The circuit card docking apparatus of claim 9 wherein said pin element is further received in a vertical slot configured in said card guide to limit movement of said circuit card in translation to and away from said socket.

11. The circuit card docking apparatus of claim 1 wherein said camming device includes a link element pivotally connected at one end to said cam mechanism and operably connected with a guide at another end to said means for operably connecting said camming device to said circuit card.

12. The circuit card docking apparatus of claim 11 wherein said cam mechanism is configured to extend in one of a direction away from said card holder and a pivoting direction away from said one surface to cause said link element to translate said card connector toward said socket.

13. The circuit card docking apparatus of claim 11 wherein said cam mechanism is configured to extend in one of a direction toward said card holder and a pivoting direction towards said one surface to cause said link element to translate said card connector toward said socket.

14. A docking apparatus for inserting a circuit card, with an edge connector, into an enclosure and inserting said edge connector into a socket mounted on one surface of a motherboard without operator access to the enclosure interior, comprising:

a card holder having said circuit card mounted thereon for movement in unison therewith;

a card guide mounted on said one surface which slidably supports said card holder for sliding movement of said card holder from the exterior of said enclosure to the interior of said enclosure to a position where said edge connector is aligned with said socket, said card guide extending from one side of a guide surface having an opposite side facing the motherboard;

a camming device operable from the exterior of said enclosure; and connecting means for interconnecting said card holder and said camming device when said card holder is positioned to align said edge connector with said socket, said camming device including a camming element movable from a first position to a second position to insert said edge connector into said socket and remove said card holder from a position of sliding support by said card guide.

15. The docking apparatus of claim 14 wherein said camming device is reversible such that moving said camming element from said second position to said first position removes said edge connector from said socket and restores said card holder to a position of slidable support by said card guide.

16. The docking apparatus of claim 15 wherein said card guide further comprises a flange extending from said guide surface having a guide slot configured to guide said card holder into and out of said enclosure.

17. The docking apparatus of claim 14 wherein said camming element includes camming surfaces configured to convert one of horizontal movement and pivoting movement of said camming element into vertical movement of said card mounted on said card holder means, whereby motion of said camming element in one direction causes said card edge connector to be inserted into said socket and motion of said camming element in another direction withdraws said edge connector from said socket.

18. The docking apparatus of claim 17 wherein said camming device further includes a pivoting linkage arm connected between said camming element and said card holder configured to convert horizontal movement of said camming element into vertical movement of said card holder, wherein motion of said camming element in one direction causes said card edge connector to be inserted into said socket and motion of said camming element in another direction withdraws said edge connector from said socket.

19. The docking apparatus of claim 14 wherein said card holder includes a plurality of locations along an upper edge and at a plurality of locations along a lower edge, each of said plurality of locations includes teeth for selectively adjusting a clip to a size of any circuit card for retention of the same.

20. The circuit card docking apparatus of claim 19 wherein said plurality of locations of support are configured to allow vertical translation of said circuit card relative to said card holder.

* * * * *